US006570507B1

United States Patent
Lee et al.

(10) Patent No.: US 6,570,507 B1
(45) Date of Patent: May 27, 2003

(54) METHOD AND SYSTEM FOR ASSIGNING UNIQUE IDENTITY CODES TO REMOTE CONTROLLERS AND CONSERVING POWER BASED ON DETECTING THE UNIQUE IDENTITY CODES

(75) Inventors: Jae-Kyung Lee, Daeku (KR); Jeong-Soo Choi, Kumi (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/195,241

(22) Filed: Nov. 18, 1998

(30) Foreign Application Priority Data

Nov. 19, 1997 (KR) .............................................. 97-61159
Dec. 30, 1997 (KR) .............................................. 97-78901

(51) Int. Cl.[7] .............................................. G05B 19/02
(52) U.S. Cl. ............................ 340/825.22; 340/825.36; 455/38.3
(58) Field of Search .................. 340/825.36, 825.49, 340/825.22, 825.69, 825.72, 539, 10.52; 455/38.3, 343; 348/180, 134

(56) References Cited

U.S. PATENT DOCUMENTS 5,752,202 A * 5/1998 Obright ....................... 455/574
5,774,065 A * 6/1998 Mabuchi et al. ......... 340/825.72
5,798,693 A * 8/1998 Engellenner ................. 340/505
5,999,799 A * 12/1999 Hu et al. ..................... 455/67.7

FOREIGN PATENT DOCUMENTS

GB          2 271 872         4/1994

* cited by examiner

Primary Examiner—Michael Horabik
Assistant Examiner—Matsuichiro Shimizu
(74) Attorney, Agent, or Firm—Finnegan, Henderson, Farabow, Garrett & Dunner, L.L.P.

(57) ABSTRACT

Methods and systems are provided for a remote-controllable electronic appliance and a remote controller. A unique call identification code is assigned to each remote controller. The remote-controllable electronic appliance may then call a remote controller based on the unique call identification code. The call identification code may continuously varied after a predetermined period of time. The call identification code may be reset based on a request by the remote controller. Power consumption by the remote controller may also be conserved based on detecting the call identification code.

18 Claims, 7 Drawing Sheets

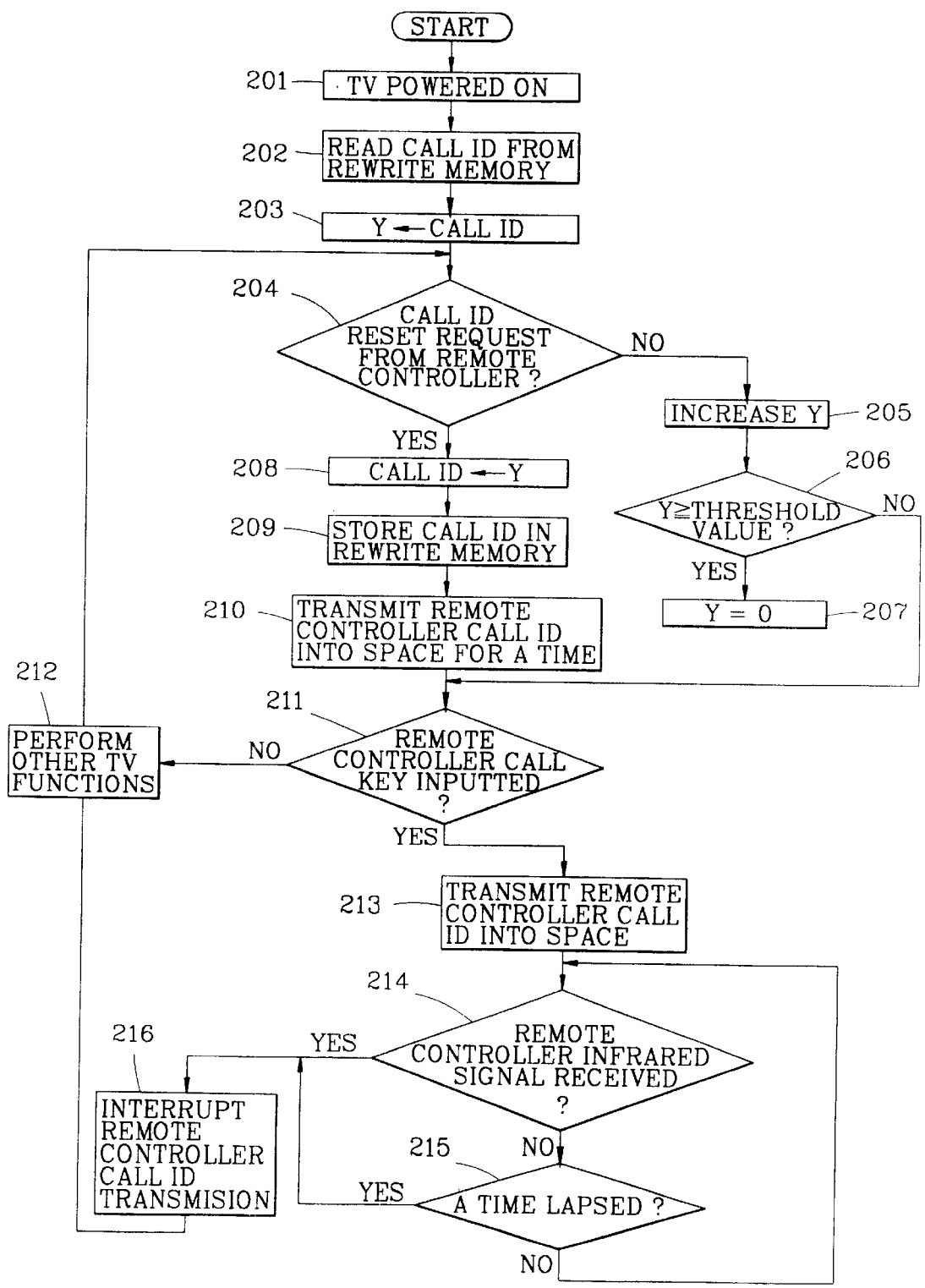

METHOD AND SYSTEM FOR ASSIGNING UNIQUE IDENTITY CODES TO REMOTE CONTROLLERS AND CONSERVING POWER BASED ON DETECTING THE UNIQUE IDENTITY CODES

BACKGROUND OF THE INVENTION

1. Field of the Invention

The present invention relates to a remote controlling system between an electronic appliance and remote controller in which the electronic appliance can call its remote controller and, more particularly, to an improved method for automatically assigning a call identification code corresponding to each remote controller and calling the remote controller: and also a power saving remote controller and electronic appliance capable of decreasing power consumption by using the method.

2. Description of the Background Art

In general, an electronic apparatus, such as a television set, audio system and other various electronic systems, have a private remote controller corresponding to them. It is a current tendency to assign various operational functions of an electronic apparatus to the corresponding remote controller for the user's convenience.

Such a remote controller, however, is usually so small, that it may easily get lost, and frequently, the user does not remember where it was placed. In order to easily find the remote controller, a method has been introduced in which the user pushes a remote controller call key attached at a television set and then transmits a remote controller call signal in space. When the remote controller receives the call signal, it makes an answer sound, thereby enabling the user to find its location.

FIG. 1 is a block diagram illustrating a general remote controlling system including a remote controllable television set and its remote controller.

As shown, a television set portion 10 related to a remote controller includes a TV microcomputer 11, a remote controller call signal transmitter 12, and an infrared receiver 13. Also, there is provided a remote controller call key button to facilitate the finding of the remote controller in case the user does not remember where it was placed. The remote control call button is connected to the TV microcomputer 11.

When the remote controller can't be easily found, the user inputs the remote controller call key through its key button disposed at the television set. In response, TV microcomputer 10 transmits a remote controller call signal via the remote controller call signal transmitter 12 into space.

The remote controller 20 includes a microcomputer 21, a remote controller call signal receiver 22, a key matrix 23, an infrared emitter 24, and an answer sound generator 25. When the call signal receiver 22 of the remote controller 20 receives a remote controller call signal outputted from the remote controller call signal transmitter 12 in the television set, the remote controller call receiver 22 notifies that fact to the microcomputer 21. Then, the microcomputer 21 generates an answer sound through the answer sound generator 25, such as a "beep", so that the user can listen to the sound and find the remote controller.

At this time, a random key input of the key matrix 23 in the remote controller by the user is understood that the user has found the remote controller, so that the answer sound generator 25 is controlled to halt its sound generation. With the key input of the remote controller by the user, the microcomputer 21 of the remote control 20 outputs a command code corresponding to the input key signal through the infrared emitter 24. The infrared receiver 13 of the television set receives the command code from the remote controller 20 and notifies it to the microcomputer 11. Accordingly, the microcomputer 11 carries out its function in accordance with the command code applied thereto.

Such remote controller call method is advantageous when there is provided only a single television set. However, when a plurality of the same kinds of television sets are installed in one household or a television set in one household is the same model as its next door neighbor's, the remote controller call signal generation from one television set may cause a plurality of remote controllers to make answer sounds at the same time, or cause a different remote controller other than the user's to respond thereto.

Further, in the case that the remote controller call function is applied to a television set, the remote controller should be continuously supplied by electrical power so as to be ready to generate an answer sound at a random call from the television set, thereby significantly increasing battery consumption of the remote controller and the electronic appliance.

SUMMARY OF THE INVENTION

It is an object of the present invention to provide a method for automatically assigning a remote control call identification code, wherein only a desired remote controller can be called using an automatic identification code assignment, thereby calling the remote controller.

It is another object of the present invention to provide a remote controller which is capable of decreasing its battery consumption through using the method.

It is another object of the present invention to provide an electronic appliance, which is provided together with a corresponding remote controller, capable of decreasing its power consumption through using the method.

It is still another object of the present invention to provide a remote controlling system including an electronic appliance and a remote controller effectively utilizing electrical power, thereby decreasing its power consumption.

To achieve the above-described objects, there is provided a method for assigning a remote controller identification code. The method comprises a step for setting a second remote controller identification code different from a first remote controller identification code set in the electronic appliance; a step for requesting a reset of the remote controller call identification code by the remote controller having the first remote controller identification code; and a step for replacing the first remote controller identification code in the electronic appliance with the second remote controller identification code in response to the request.

Further, to achieve the above-described objects, there is provided a method for assigning a remote controller identification code and calling the remote controller. The method comprises a step for setting a second remote controller identification code different from a first remote controller identification code which is set in the electrical appliance; a step for requesting a reset of the remote controller identification code by the remote controller having the first remote controller identification code; a step for replacing the first remote controller identification code in the electronic appliance with the second remote controller identification in response to the request and resetting the replaced value as the identification code to the remote controller; a step for calling the remote controller by transmitting a remote controller call signal in accordance with the identification code from the electronic appliance having an identification code identical to the set identification code; a step for receiving the remote controller call signal; a step for comparing whether the identification code detected from the remote controller call signal corresponds to one set in the remote controller; and a step for generating an answer sound when the identification codes correspond to each other.

Still further, to achieve the above-described objects, there is provided an electronic appliance and remote controller having a function of assigning a remote controller identification code wherein the electronic appliance comprises a rewrite memory means disposed in the electronic appliance and for storing therein a first remote controller identification code; a memory means disposed in the electronic appliance and for generating and temporarily storing therein a second remote controller identification code different from the first remote controller identification code; a transmission means for transmitting the first remote controller identification code when calling the remote controller, and transmitting the second remote controller identification code the remote controller in response thereto when the remote controller having the first remote controller identification code has requested a reset of the remote controller call identification code; and an electronic appliance control means for replacing the first remote controller identification code in the electronic appliance with a second remote controller identification, storing the replaced value in the rewrite memory means so as to reset the same into the remote controller as the identification code, and controlling the remote controller call transmission means and the respective memory means. Also, the remote controller comprises a remote controller call signal reception means; means for transmitting the remote controller identification code reset request signal when the remote controller is initialized; a memory means for storing therein the first remote controller identification code, and storing therein the second remote controller identification code instead of the first remote controller identification code when the second remote controller identification code is received from the electronic appliance through the remote controller call signal reception means after being requested to reset the remote controller identification code; and a remote-controller control means for comparing the remote controller identification code stored into the memory means, controlling to generate the answer sound and controlling the transmission means and the memory means, in response to the remote controller call.

Also, to achieve the above-described objects, there is provided a remote controller having a function of assigning a remote controller identification code. The remote controller comprises a call signal reception means for detecting a remote controller call signal transmitted having the remote controller identification code from the electronic appliance; a control means for controlling to respond only when the detected identification code and the previously set identification code are identical to each other; and a means for activating the call signal reception means only when the identification code is possible to identify from the electronic appliance, in response to the control means, wherein the control means controls the activation means and the call signal reception means has a periodic activation period.

In order to further achieve the above-described objects, there is provided an electronic appliance having a function of assigning a remote controller identification code. The electronic appliance comprises a remote-controller call signal transmission means for transmitting a remote controller call signal having the remote controller identification code during a predetermined time period so as to call the remote controller; and a control means for activating the remote controller call signal transmission means, only during the call signal transmission period in response to the remote controller call.

The object and advantages of the present invention will become more completely disclosed and described in the following specification, the accompanying drawings and the appended claims.

BRIEF DESCRIPTION OF THE DRAWINGS

FIG. 2 is a flow chart illustrating an operation of the television set for assigning an identification code to a remote controller which corresponds to the television set according to the present invention;

DETAILED DESCRIPTION OF THE PREFERRED EMBODIMENTS

Figure 3A:
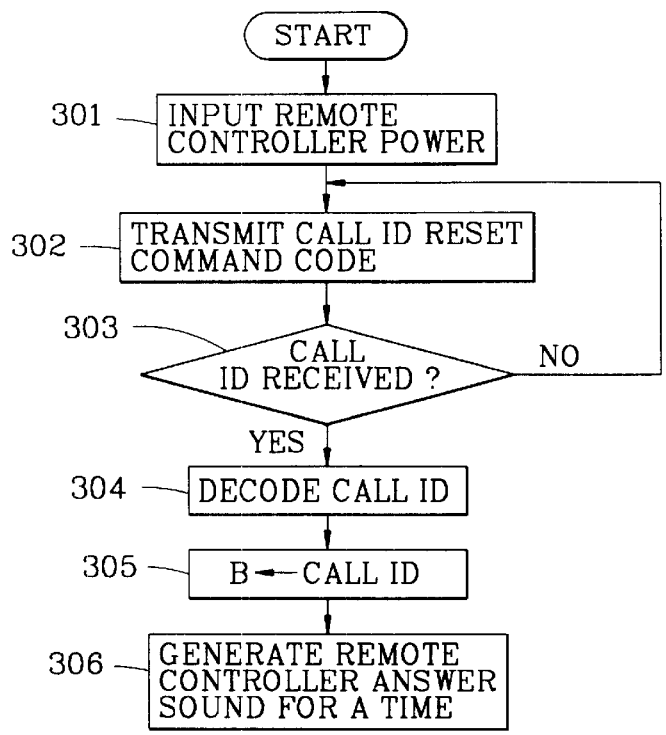
FIG. 3A is a flow chart illustrating an operation of the remote controller for assigning a call identification code according to the present invention.
Figure 3B:
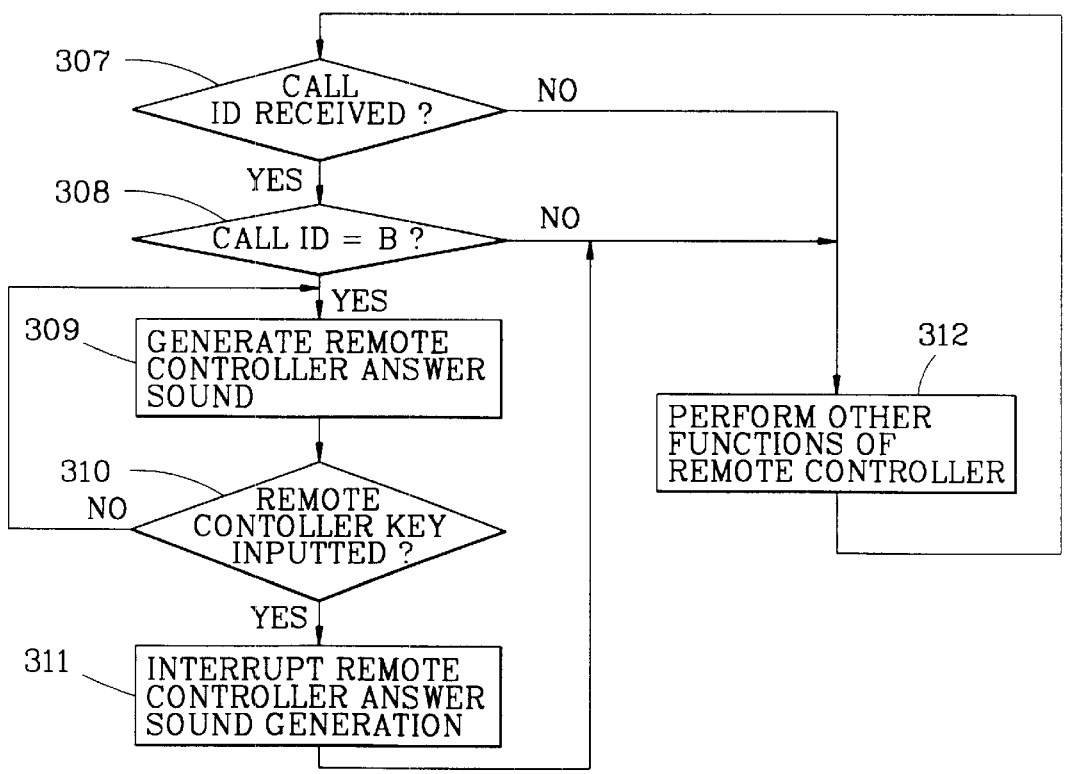
FIG. 3B is a flow chart illustrating answering steps to the remote controller call according to the present invention.

FIG. 2 is a flow chart illustrating an operation of a television set for assigning an identification code to a remote controller, which corresponds to the television set. FIG. 3A is a flow chart illustrating an operation of the remote controller for assigning a call identification code, and FIG. 3B is a flow chart illustrating answering steps to the remote controller call, respectively, according to the present invention.

Figure 1:
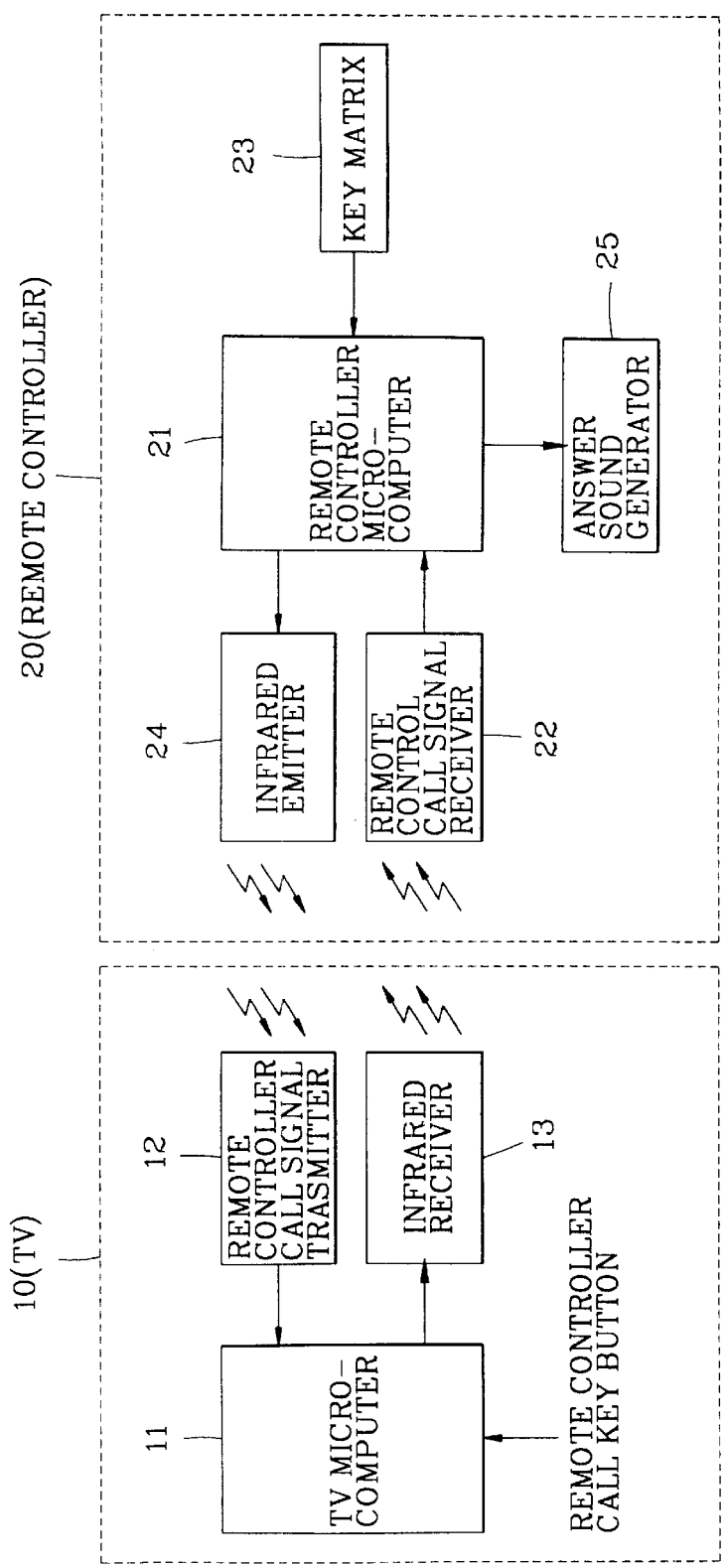
FIG. 1 is a block diagram illustrating a general remote controlling system including a television set and its remote controller.

It is noted that FIG. 1, which shows a general remote controlling system, is referenced in order to illustrate a method for assigning a call identification code according to the present invention.

At step 201 in FIG. 2, when a user can't remember where a remote controller for remote controlling a television set is located, the television set is powered on manually. If the user has the remote controller, the television set is powered on by user's manipulation of the remote controller. Then, the microcomputer 11 becomes reset.

At step 202, the microcomputer 11 reads a remote controller call identification code serving as a first remote controller code from a rewrite memory (not shown), such as an EEPROM. The read remote controller identification code is temporarily stored in a storage member, such as a register, a temporary memory and a flag. The storage member is set as a variable "Y" for convenient illustration, and thus, the read call identification code is stored in variable Y (step 203).

At step 204, it is checked whether there is a reset request of the call identification code from the remote controller. When the television set is powered on without using the remote controller, the result of step 204 will become "No." When the remote controller is used to turn on the television set, a command with regard to the reset request of the call identification code is automatically generated from the remote controller, and the television set receives the result, thereby step 204 turns out "Yes". Further detail will be described later.

When a reset request of the call identification code is determined not to have been received through the remote controller, that is, the result of step 204 is "No", the variable Y is increased per a predetermined time in the television set at step 205. The variable Y is utilized as a second remote controller identification code which is different from the first remote controller identification code. At this time, the increased value of Y is compared to a threshold value at step 206. If the increased value of Y is equal to or larger than the threshold value, the variable Y is reset as "0", and if it is less than the threshold value, the step 206 is directed to step 211.

At steps 205 through 207, the television set automatically assigns an identification code to the remote controller, wherein the threshold value is set by a designer at a random value, for example, at 10, 20, 30 or 100, depending upon television set makers or models. Also, at steps 205–207, the increase of variable Y can be by one ("1") or by an equivalent value of a required amount and carried out at each predetermined time period. This is for generation of different identification codes. The generation may occur in sequence or at random.

Step 211 checks whether the remote controller call key is inputted. When the television set is controlled by the remote controller, the flow proceeds to step 212 to perform other functions of the television because there is no remote controller call key input at step 211, However, when the television set is manually turned on, the user is supposed to manipulate the remote controller call key attached at the television set. Consequently, step 211 results in "Yes" and succeeds to step 213 at which time the television set transmits the first remote controller call identification code stored in the rewrite memory into space; When the remote controller call identification code stored in the rewrite memory is transmitted into space to find the remote controller at step 213, the transmitted identification code is received by the remote controller, thereby the remote controller is supposed to perform the process shown in FIG. 3A, which will be described in detail later.

In FIG. 3B, the microcomputer 21 of the remote controller 20 checks the reception of the call identification at step 307, and when the call identification is not received, other functions of the remote controller are performed at step 312.

In the meantime, when the remote controller call identification is received through the remote controller call signal receiver 22, and the received call identification is determined to correspond to a register value B in the remote controller, it is understood that the remote controller call has been requested. Accordingly, through the answer sound generator 25, an answer sound recognizable to the user is generated for a predetermined time period for the user to find the remote controller at step 309.

At this time, when the user pushes the key matrix 23 of the found remote controller 20 at step 310, the microcomputer 21 controls the answer sound generator 25 to thereby interrupt the generation of the remote controller answer sound at step 311, thereby performing other functions of the remote controller at step 312.

Accordingly, since the user found the remote controller and will begin manipulation of the remote controller, the television set checks whether a predetermined infrared signal is applied thereto from the remote controller as described at steps 214 in FIG. 2. When the user has found the controller, the television set halts the transmission of the remote controller call identification code.

At step 214, if a signal is not received from the remote controller, step 214 proceeds to step 215 so as to check whether a predetermined time has lapsed. If it is determined that the predetermined time has not lapsed and that the infrared signal has not been received, the remote controller call identification code is continuously transmitted into space. When the infrared signal has not been received, and when a predetermined time has lapsed, it is understood that the remote 11 controller has not been found or that some kind of error has occurred, thereby the transmission of the remote controller call identification code is halted. Then, the step proceeds to step 212 for carrying out other functions of the television set.

Therefore, only the remote controller corresponding to the television set is called according to the present invention.

Now, there will be described a resetting demand of the call identification code from the remote controller at step 204. This relates to a state in which a battery for the remote controller is mounted in the remote controller or a new battery is replaced with an old one.

As shown in FIGS. 2 and 3A, when power is supplied into the remote controller 20 by a battery replacement at step 301, the microcomputer 21 in FIG. 1 becomes reset and has its power supply halted, and at the same time, the remote controller call identification code becomes automatically erased, so that the microcomputer 21 transmits a command code demanding a resetting of the call identification through the infrared emitter 24 to the television set in the form of infrared ray at step 302. Then, the infrared receiver 13 of the television set 10 receives the infrared ray released from the infrared emitter 24 of the remote controller and notifies the microcomputer 11 which in turn decodes the data to thereby recognize the call identification reset command from the remote controller 20 at step 204. That is, when the call identification reset command is received from the remote controller, the microcomputer 11 of the television set recognizes that an electrical power is newly supplied for the remote controller 20 and that the remote identification is deleted. At steps 205 through 207, variable Y varies as each predetermined time period is reset, serves as a call identification as a second remote controller identification code, and the call identification is stored in a rewrite memory at step 209.

The stored remote controller call identification is transmitted to the remote controller 20 for a predetermined time at step 210. Thereafter, the remote controller 20 transmits the call identification reset command in the form of infrared ray. When the call identification is received while checking the reception at step 303, the received call identification is decoded at step 304 and the decoded value is stored in a register B within the remote controller at step 305. Then, the reset of the remote controller call identification is reported by generating a remote controller response sound through the response sound generator 25 for a predetermined time.

A power saving remote controller and electronic appliance capable of decreasing their battery consumption effectively using the above method will now be described.

Figure 4:
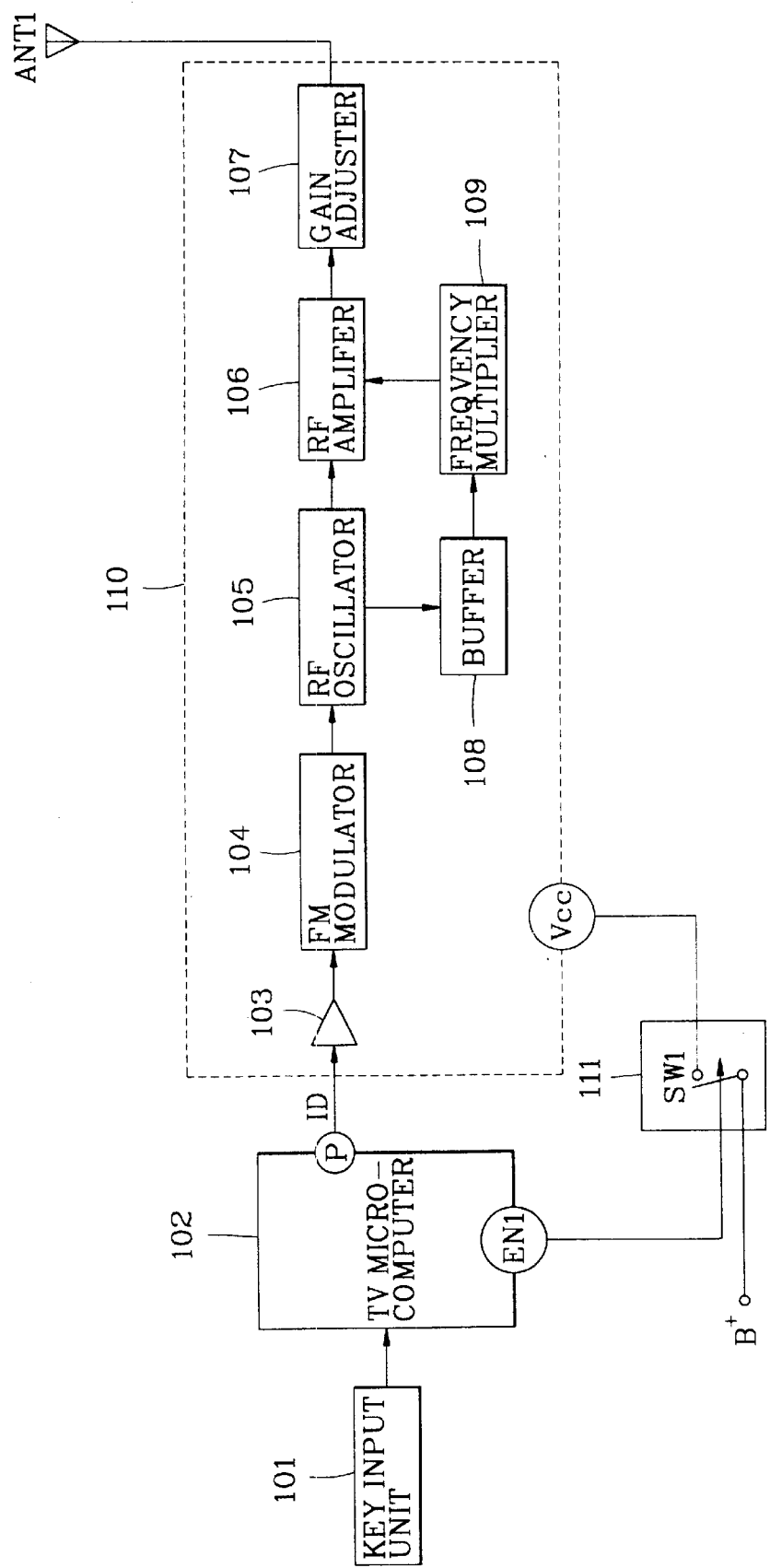
FIG. 4 is a block diagram illustrating a circuit for controlling the remote controller by the television set.

As shown in FIG. 4, the power saving circuit for the television set according to the present invention includes a television microcomputer 102 for outputting the remote controller call identification while activating and outputting an enable signal "EN1" for a predetermined.time by recognizing the pushing of the remote controller call button on a key input unit 101; a call signal transmitter 110 for transmitting to the remote controller a resultant signal by amplifying and modulating the remote controller call identification signal provided from the microcomputer 102; and a first power source control unit 110 operated in accordance with the enable signal EN1 and for providing an external voltage supplied through a source terminal B* to the call signal transmitter 110.

When a remote controller call is not required, the call signal transmitter 110 does not need to be operated, a source enable signal is outputted to become inactive or "high" at the enable terminal EN1 of the television microcomputer 102. Accordingly, a switch "SW1" of the first power source control unit 111 becomes opened (turn-off). As a result, power is not provided to the call signal transmitter 110, thereby deactivating the transmitter 110.

However, when the call button provided on the key input unit 101 of the television set is pushed by a user to find the remote controller, the microcomputer 102 recognizes the key signal, and the source enable signal becomes activated to "low" through the enable terminal EN1. Accordingly, the switch SW1 of the first source control unit 111 becomes turned:on so that the external power source provided through the source terminal B is supplied to the source terminal Vcc of the call signal transmitter 110 through the switch SW1, thereby switching the call signal transmitter 110 to its operational state;

At this time, the microcomputer 102 outputs an identification signal which is set toward the call signal transmitter 110 through the output port P. This can be the same signal as the identification signal as described above with reference to FIG. 2.

An identification signal, as shown in FIG. 4, is amplified to an appropriate level by the amplifier 103 of the call signal transmitter 110 and frequency-modulated, for example, to a frequency of 16.620 MHz in accordance with the FM modulator 104. The FM modulated signal is converted to a radio frequency RF through the radio frequency oscillator 105 and the buffer 106, and then multiplied to a frequency of about 50 MHz by the frequency multiplier 107. The multiplied signal is transmitted through the radio frequency amplifier 108 and adjusted to an appropriate gate through the gain adjuster 109 and transmitted through the transmission antenna "ANT1."

Figure 6:
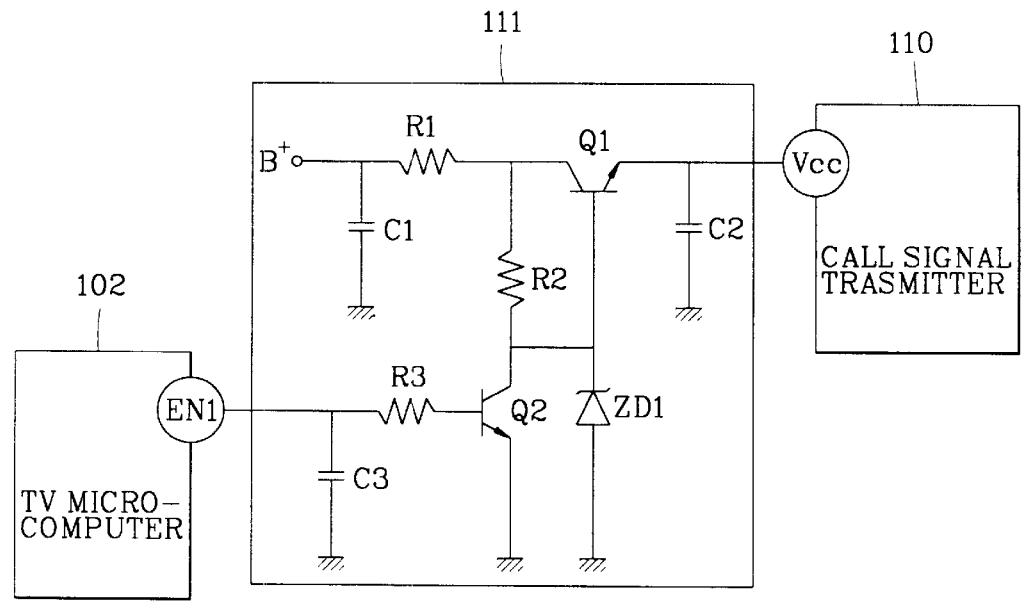
FIG. 6 is a circuit view detailing a first power control unit in the circuit of FIG. 4.
Figure 7:
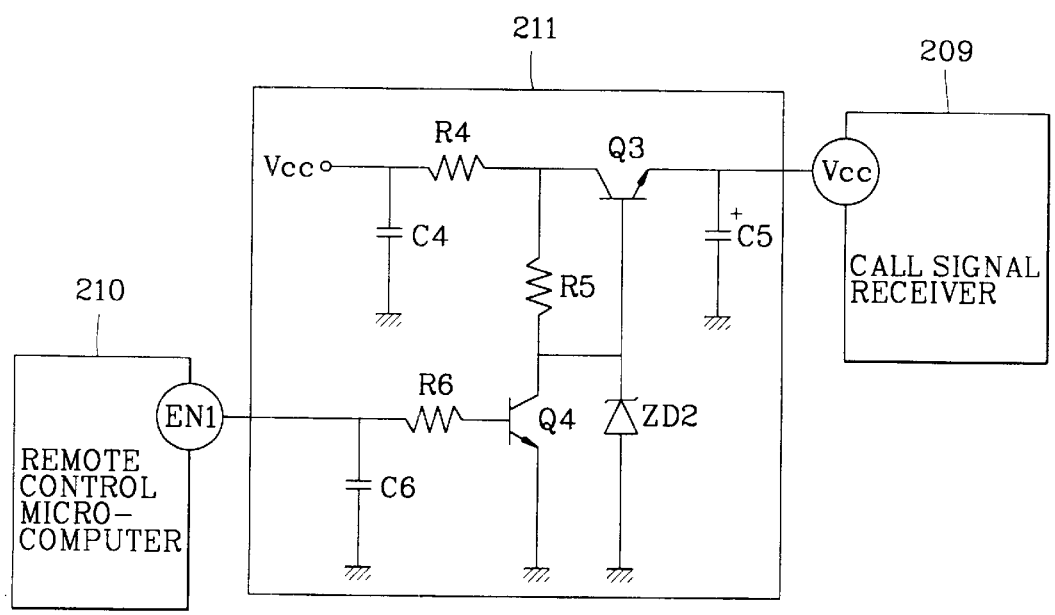
FIG. 7 is a circuit view detailing a second power control unit in the circuit of FIG. 5.

The preferred embodiment of the present invention with regard to the composition of the switch SW1 schematically illustrated in FIG. 4 will now be described with reference to FIG. 6.

When the source enable signal becomes active to "low" at the enable terminal EN1 of the television microcomputer 102, the transmitter "Q2" is turned off. Accordingly the external voltage supplied through the source terminal B* is charged in the capacitor "C1" through the resistance "R1." The charged voltage is provided to the base of the transistor Q1 through the resistance "R2" to thereby turn on the transistor Q1, whereby the charged voltage is provided to the source terminal Vcc of the call signal transmitter 110 through the transistor Q1 and the capacitor "C2."

However, when the source enable signal becomes inactive or "high" at the enable terminal "EM" of the microcomputer 102, the transistor "Q2" is turned on. Accordingly, the transistor Q1 is turned off so that voltage is not provided to the source terminal Vcc of the transmitter 110.

Figure 8A:
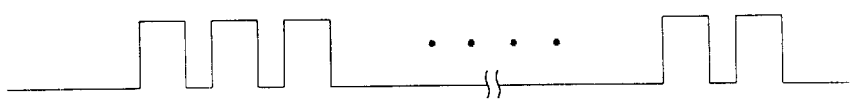
FIG. 8A is a timing diagram of an identification signal.
Figure 8B:
FIG. 8B is a timing diagram of an enable signal applied to the first power control unit.

FIG. 8B is a timing diagram showing an operational time of the call signal transmitter 110 in accordance with the enable signal outputted from the television microcomputer 102. FIG. 8A is a timing diagram showing a wave form of the identification signal continuously outputted from the microcomputer 102 during the operational time period. The wave forms are also understood to express random numbers as illustrated in FIG. 2. Likewise, when the call button is pushed, the power source is received for a predetermined time period to thereby operate the call signal transmitter 110.

Figure 5:
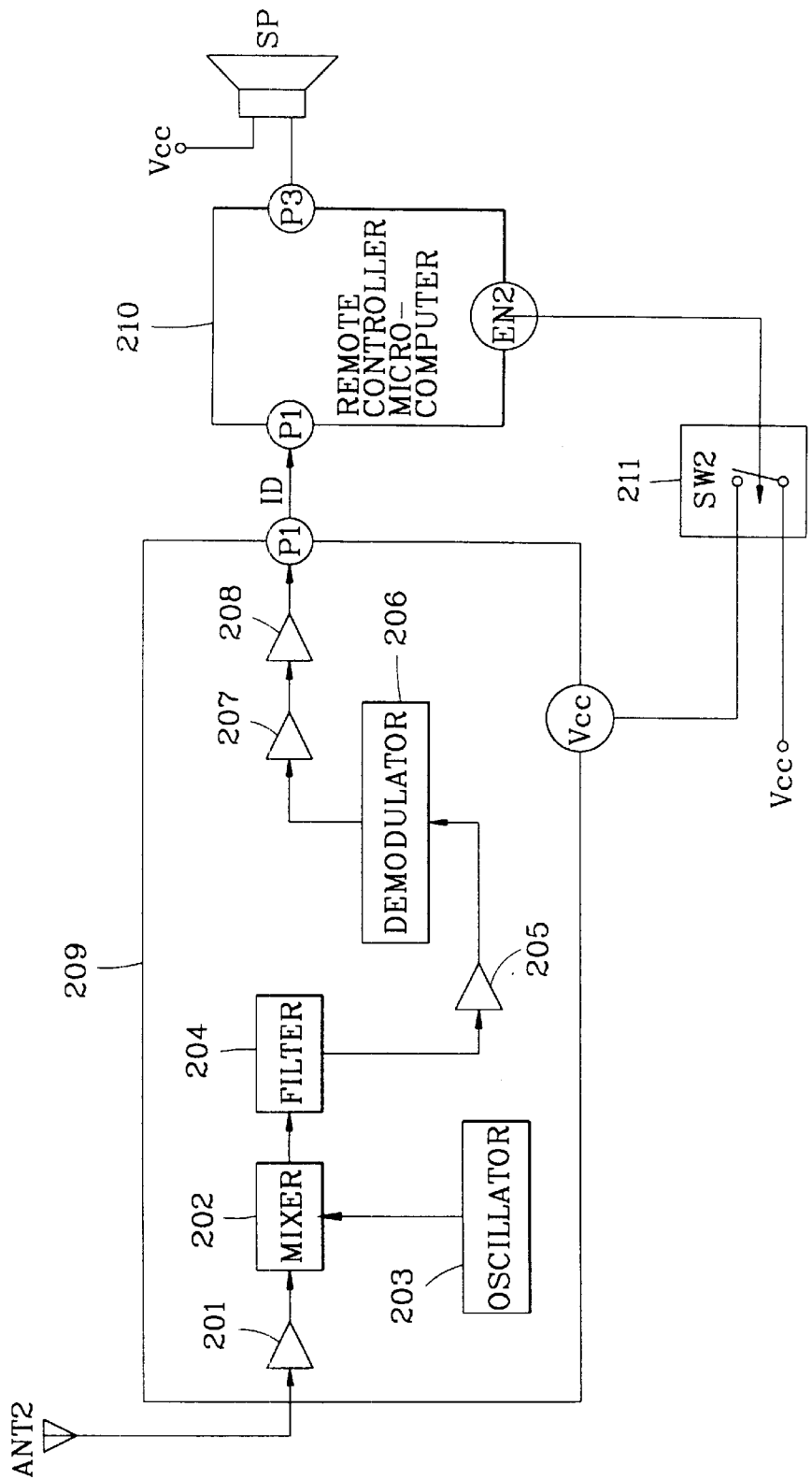
FIG. 5 is a block diagram illustrating a circuit for a power-saving remote controller according to the present invention.

FIG. 5 is a composition view of the power saving remote controller according to the present invention. As shown therein, the power saving remote controller includes the call signal receiver 209 for detecting an original remote controller call identification signal by amplifying and demodulating the call signal outputted from the television call signal transmitter 110; a remote control microcomputer 210 for driving a speaker "SP" for a corresponding time period coinciding with after the comparison of the detected identification and the previously stored identification and activating an enable signal "EN2" to a predetermined pattern so as to operate the call signal receiver 209 to a power saving mode; and a second source control unit 211 for being driven by the enable signal EN2 and supplying a battery voltage through the source terminal Vcc to the call signal receiver 209.

The reflection wave signal transmitted through the transmission antenna ANT1 of the television call signal transmitter 110 is received through the remote control reception antenna ANT2 and amplified to an appropriate level by the amplifier 201 and then provided to the mixer 202.

The mixer 202 mixes the applied reflection wave signal and an oscillation signal (for example, 49.402 MHz) supplied from the oscillator 203. The output signal of the mixer 202 is filtered by a ceramic filter 204 and confined to a predetermined amplitude by a limiter 205.

A predetermined amplitude of signal outputted from the limiter 205 is provided to a demodulator 206 and accordingly the original call signal is restored. A low frequency call signal outputted from the demodulator 206 is amplified to an appropriate level through an amplifier 207 and filtered by a filter 208, from which the original identification signal is detected. The detected identification signal is transferred to the remote control microcomputer 210 through an output port "P1." Then, the microcomputer 210 compares the identification detected through the processing steps as described above in the call signal receiver 209 with one stored in the register B as described in FIG. 3, which is previously set. If identical, a predetermined frequency of signal for a predetermined time period is outputted through an output port "P3" to the speaker SP. Accordingly, the user can easily find the remote controller in response to the sound.

Figure 8C:
FIG. 8C is a timing diagram of an identification signal outputted from a call signal receiver.
Figure 8D:
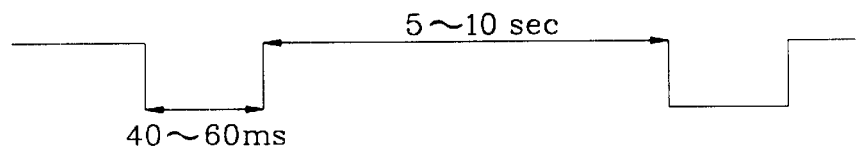
FIG. 8D is a timing diagram of an enable signal applied to the second power control unit.

At this time, the microcomputer 210, in order to prevent a battery expectancy of the remote control from being decreased by its continual operation, controls the second source control unit 211; as described in FIG. 5, to the same cycle as that described in FIG. 8D, whereby the battery source Vcc provided to the call signal receiver 209 is opened or closed to a corresponding cycle. Therefore, the call signal receiver 209 periodically turns on and off its operation. During its turn-on period the receiver 209 operates so that the call signal outputted from the television set can be detected. For instance, if a call signal for searching the remote controller is to be outputted for 13 seconds in the television set, the receiver of the remote controller is repeatedly operated for 40–60 ms, the power supply is interrupted for 5 seconds, and the call signal is sufficiently detected.

When the source enable signal at the enable terminal EN2 of the remote control microcomputer 210 is outputted by becoming active to "low", a transistor "Q4" is turned off accordingly, and a transistor "Q3" is turned on. Therefore, the battery voltage supplied through the source terminal Vcc is provided to the source terminal Vcc of the call signal receiver 209 through the resistance R4, the transistor Q3 and the capacitor C5.

However, when the source enable signal at the enable terminal EN2 of the remote control microcomputer 210 is outputted becomes inactive or "high", the transistor Q4 s turned on and accordingly the transistor Q3 is turned off, whereby the battery voltage to the source terminal Vcc of the receiver 209 becomes halted.

Consequently, the microcomputer 210, in order to prevent the battery power of the remote controller from being inadvertently discharged as shown in FIGS. 8C and 8D, outputs a "low" signal to the second source control unit 211 during a time period (for example 40–60 ms) to the extent that, for example, two identification signals can be detected, so that the call signal receiver 209 is driven, and then a "high" signal is outputted for 5–10 seconds so as to stop the operation of the call signal receiver 209. Then, during a time period (50–60 ms) to the extent that two identification signals can be detected, a "low" signal is outputted to the second source control unit 211, for operating the call signal receiver 209.

Accordingly, the call signal receiver 209 detects the identification signal and is operated for a least a time period so that the battery power consumption becomes significantly decreased as compared to that of the conventional art.

According to the present invention, a proper identification is assigned to the remote controller through the television set so that it is possible to call only a corresponding remote controller without interruption during the remote controller call. Also, while continuously varying the call identification in the television set each predetermined time, if the remote controller demands a reset of the call identification, the call identification at that time is automatically set, thereby providing a significant convenience to the user as well as assigning different call identifications to other kinds and models.

Further, in the present invention, the power is provided to the call signal transmitter disposed in the television set for a limited time period from a reference time point at which the remote controller,identification button is pushed by the user, and the power is supplied to operate the call signal receiver for a very short time period in the remote controller, thereby significantly elongating the battery expectancy as compared to the conventional case in which the call signal receiver is always kept at a standby mode.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A method for assigning a remote controller identification code, wherein a remote controller responds to a remote controller call in accordance with a remote controller identification code from an electronic appliance which is operable by a remote control manipulation comprising:

setting a first remote controller identification code for the remote controller in the electronic appliance;

setting a second remote controller identification code different from the first remote controller identification code;

receiving a demand for a reset by the remote controller having the first remote controller identification code; and replacing the first remote controller identification code in the electronic appliance with the second remote controller identification code in response to the demand.

2. The method of claim 1, wherein setting the second remote controller identification code different from the first remote controller identification code comprises:

reading a remote controller identification code from a memory when the electronic appliance is initialized;

setting the second remote controller identification code by varying the first remote controller identification code based on a predetermined time period; and storing in the memory the second remote controller identification code set at the time point when the demand for the reset is received.

3. The method of claim 1, wherein replacing the first remote controller identification code in the electronic appliance with the second remote controller identification code in response to the demand comprises:

decoding and storing the second remote controller identification code received from the electronic appliance; and identifying the second remote controller identification code.

4. The method of claim 3, wherein setting the second remote controller identification code comprises sequentially increasing the second remote controller identification code up to a set threshold value based on a predetermined time period.

5. The method of claim 3, wherein setting the second remote controller identification code comprises randomly generating the second remote controller identification code based on a predetermined time period.

6. A method for assigning a remote controller identification code and calling the remote controller, wherein a remote controller responds to a remote controller call in accordance with a remote controller identification code from an electronic appliance which is operable by a remote control manipulation comprising:

setting a first remote controller identification code for the remote controller in the electronic appliance;

setting a second remote controller identification code different from the first remote controller identification code;

receiving a demand for a reset by the remote controller having the first remote controller identification code;

replacing the first remote controller identification code in the electronic appliance with the second remote controller identification in response to the demand;

setting a call identification code based on the second remote controller identification code;

calling the remote controller by transmitting a remote controller call signal based on the call identification code from the electronic appliance;

comparing whether the call identification code detected from the remote controller call signal corresponds to the second remote controller identification code; and generating an answer sound when the call identification code corresponds to the second remote controller identification code.

7. The method of claim 6, wherein calling the remote controller further comprises interrupting the remote controller call signal based on a user's manipulation from the remote controller in response to the answer sound.

8. The method of claim 6, wherein calling the remote controller further comprises interrupting the remote controller call signal based on when a predetermined time has lapsed.

9. The method of claim 6, wherein further comprising interrupting the answer sound based on when a lockup key is inputted or based on when a predetermined time has lapsed.

10. The method of claim 6, further comprising:

reading a remote controller call identification code from a memory when the electronic appliance is initialized;

setting a second call identification code by varying the remote controller call identification code based on a predetermined time; and storing the second call identification code in the memory demand for a reset is received from the remote controller; and transmitting the second call identification code to the remote controller.

11. The method of claim 6, further comprising:

decoding and storing the call identification code received from the electronic appliance; and confirming the call identification code.

12. The method of claim 6, wherein receiving the remote controller call signal is periodically activated based on a time period to identify the call identification code of the remote controller call signal from the electronic appliance.

13. A system comprising an electronic appliance and a remote controller wherein the remote controller responds to a remote controller call including a remote controller identification code from the electronic appliance, said electronic appliance comprising:

a rewrite memory for storing a first remote controller identification code;

a memory for generating and temporarily storing a second remote controller identification code different from the first remote controller identification code;

a transmission means for transmitting the first remote controller identification code when calling the remote controller, and transmitting the second remote controller identification code to the remote controller based on when the electronic appliance has received a demand for a reset from the remote controller;

an electronic appliance control means for replacing the first remote controller identification code with the second remote controller identification code, storing the second remote controller identification code in the rewrite memory; and wherein said remote controller comprises:

reception means for receiving a remote controller call signal;

a means for transmitting the demand for the reset when the remote controller is initialized;

a memory means for storing the first remote controller identification code, and replacing the first remote controller identification code with the second remote controller identification code when the second remote controller identification code is received from the electronic appliance after transmission of the demand for the reset; and a remote controlling means for comparing the first remote controller identification code stored in the memory means of the remote controller with the first remote controller identification code transmitted by the electronic appliance, and generating an answer sound when the first remote controller identification code stored in the memory means of the remote controller matches the first remote controller identification code transmitted by the electronic appliance.

14. The system of claim 13, wherein said electronic appliance further comprises a means for activating the call signal reception means based on a time period for transmission by the remote controller, and for periodically activating the call signal reception means.

15. The system of claim 13, wherein said remote controller call signal transmission means of the electronic appliance further comprises a control means for activating the remote controller call transmission means during the a signal transmission time period for calling the remote controller.

16. A remote controller having an assigned remote controller identification code, wherein the remote controller responds to a remote controller call including a remote controller identification code from an electronic appliance, the remote controller comprising:

a call signal reception means for detecting a remote control call signal transmitted from the electronic appliance having the remote controller identification code;

transmission means for transmitting the remote controller identification code reset request signal when the remote controller is initialized;

a memory means for storing a first controller identification code, and storing a second remote controller identification code instead of the first remote controller identification code when the second remote controller identification code is received from the electronic appliance through the call signal reception means after being requested to reset the remote controller identification code;

a remote-controller control means for determining when the remote controller identification code stored in the memory means and a remote controller identification code which is received from the electronic appliance are identical to each other, controlling generation of an answer sound, and controlling the transmission means and the memory means in response to the remote controller call; and a means for selectively providing power to the call signal reception means based on detection of the remote control call signal by the call signal reception means during a periodic activation period.

17. The remote controller of claim 16, wherein a duration of the periodic activation period is approximately 40–60 ms.

18. An electronic appliance capable of assigning a remote controller identification code, wherein a remote controller responds to a remote controller call including the remote controller identification code, the electronic appliance comprising:

a rewritable memory means for storing a first remote controller identification code;

a memory means for storing a second remote controller identification code instead of the first remote controller identification code;

a remote controller call signal transmission means for transmitting the first remote controller identification code when calling the remote controller, and transmitting the second remote controller identification code to the remote controller when the remote controller having the first remote controller identification code has requested a reset of the remote controller identification code; and an electronic appliance control means for replacing the first remote controller identification code in the electronic appliance with the second remote controller identification code to reset the same into the remote controller as its identification code, and selectively providing power to the remote controller call signal transmission means.

* * * * *